United States Patent

Robertson et al.

Patent Number: 5,665,251
Date of Patent: Sep. 9, 1997

[54] RIE IMAGE TRANSFER PROCESS FOR PLATING

[75] Inventors: Neil Leslie Robertson, Campbell; Hugo Alberto Emilio Santini, San Jose; Clinton David Snyder, Los Gatos, all of Calif.

[73] Assignee: International Business Machines Corporation, Armonk, N.Y.

[21] Appl. No.: 344,241

[22] Filed: Nov. 23, 1994

[51] Int. Cl.$^6$ ............................................. B44C 1/22
[52] U.S. Cl. ........................... 216/22; 216/40; 216/47; 430/323
[58] Field of Search ............................... 216/22, 40, 47; 430/323, 291

[56] References Cited

U.S. PATENT DOCUMENTS

| | | | |
|---|---|---|---|
| 4,332,880 | 6/1982 | Izu et al. | 430/272 |
| 4,481,497 | 11/1984 | Kurtz et al. | 338/2 |
| 4,670,323 | 6/1987 | Nakamura et al. | 428/172 |
| 4,770,899 | 9/1988 | Zeller | 427/96 |
| 4,826,564 | 5/1989 | Desilets et al. | 156/643 |
| 4,838,994 | 6/1989 | Gulde et al. | 216/22 |
| 4,855,264 | 8/1989 | Mathers et al. | 501/98 |
| 4,933,058 | 6/1990 | Bache et al. | 204/192.3 |
| 4,957,886 | 9/1990 | Mathers et al. | 501/96 |
| 5,059,278 | 10/1991 | Cohen et al. | 156/643 |
| 5,073,475 | 12/1991 | Lauke et al. | 430/278 |
| 5,104,709 | 4/1992 | Kokaku et al. | 428/694 |
| 5,141,623 | 8/1992 | Cohen et al. | 216/22 |
| 5,166,037 | 11/1992 | Atkinson et al. | 430/315 |
| 5,190,793 | 3/1993 | Berlin et al. | 427/96 |
| 5,192,581 | 3/1993 | Hirsch et al. | 427/556 |
| 5,212,609 | 5/1993 | Yuito et al. | 360/113 |
| 5,219,651 | 6/1993 | Shoji et al. | 428/323 |
| 5,256,266 | 10/1993 | Blanchette et al. | 204/192.3 |
| 5,393,376 | 2/1995 | Chen et al. | 216/48 |

Primary Examiner—John S. Chu
Attorney, Agent, or Firm—Baker, Maxham, Jester & Meador

[57] ABSTRACT

A method is provided for constructing well defined plated miniature metallic structures. A seedlayer may be formed over an insulative layer such as a gap layer of a write head. A protective layer, such as alumina or silicon dioxide, is formed on top of the seedlayer to protect it from a subsequent reactive ion etching (RIE) step. A relatively thick layer of material, such as polymeric photoresist, is formed on top of the protective layer, the thick layer being of a type of material which can be patterned by reactive ion etching. By photolithography, an RIE mask, such as a thin layer of patterned metal, is formed on top of the relatively thick resist layer. The pattern of the mask corresponds to the desired shape of the metallic structure to be formed by plating. After masking the relatively thick layer the relatively thick layer is anisotropically etched by RIE. After the thick layer is RIE'd the protective layer on top of the seedlayer portion to be plated is removed by an etchant such as an aqueous alkaline etchant containing EDTA. It is important that the polymeric photoresist not be attacked by this etchant since it would undercut the high definition required for the metallic structure. After the protective layer portion is removed electrodeposition takes place to plate the desired metallic structure on the seedlayer portion. After plating the remaining relatively thick layer can be removed by reactive ion etching and the remaining protective layer can be removed by the aforementioned etchant containing EDTA to leave the desired freestanding metallic structure with miniature high resolution features.

39 Claims, 7 Drawing Sheets

RIE IMAGE TRANSFER PROCESS FOR PLATING

BACKGROUND OF THE INVENTION

1. Field of the Invention

The present invention relates to an image transfer process for patterned plated structure and more particularly to a process employing reactive ion etching (RIE) to pattern a thick layer of material without destroying a seedlayer where a miniature metallic structure is to be plated.

2. Description of the Related Art

Numerous electronic products require the construction of miniature metallic structures, some of which may be less than 10 microns in width. A prime example is the second pole tip of a thin film recording head. Other examples are electronic packages for semiconductors and circuit boards, back end of line (BEOL) structures for semiconductors, and micromechanics, such as miniature motors, gears and actuator arms fabricated on wafers. An image transfer process may be employed for fabricating these miniature metallic features. Image transfer processing enables the creation of high aspect ratio features which may exceed the resolution obtainable by thick layer photolithography patterning.

In a thin film recording head, the width of the pole tip of a second pole piece is made as narrow as possible in order to increase track density, namely the number of tracks per inch width of the magnetic medium on which the head writes. The higher the track density the more bits per square inch can be stored on the magnetic medium. Thin film heads with trackwidths in the order of two to three microns have been fabricated. Efforts are now being made to achieve submicron trackwidths.

The pole tip of the second pole piece of a recording head is formed over an insulative gap layer that separates it from the pole tip of the first pole piece. Both pole tips may be constructed of metal, such as Permalloy (NiFe). In fabricating the pole tip of the second pole piece over the gap layer, a seedlayer is sputtered onto the gap layer to provide an electrical path for plating the pole tip by electrodeposition. The thickness of the plating is dependent upon the thickness of the material which forms the pattern. The thick layer of material is normally a thick layer of polymeric photoresist patterned to the desired width of the pole tip of the second pole piece. Other materials for the thick layer, employed for patterning, may be organic polymeric resin or an inorganic material, such as $SiO_2$. This thickness may be on the order of 5 to 6 microns due to the underlying thin film head topography.

When light is directed through the thick layer, it scatters laterally as it penetrates the depth of the layer in the same way that light scatters laterally in a column of water. In order to overcome this problem a top surface imaging process, such as image transfer, can be employed to pattern the thick layer. With this process a thin metallic masking layer is typically formed on top of the thick layer. A thin photoresist layer, in the order of 1 micron, is formed on top of the thin metallic masking layer. The thin photoresist layer is planar since it has been formed over the thick layer which is planar. The thin photoresist layer will cause minimal lateral scattering compared to the lateral scattering within the thick layer. Accordingly, the thin photoresist layer can be patterned with normal photolithography with good resolution to expose a portion of the masking layer. The exposed portion of the masking layer is then removed by etching to expose a top portion of the thick layer in the area where the second pole tip is to be formed. The thin photoresist layer may then be removed leaving the masking layer on top of the thick layer. A reactive ion beam is then directed toward the exposed top portion of the thick layer, which will etch away a cavity for the pole tip all the way to the seedlayer. RIE is highly anisotropic and will etch the thick layer with well defined vertical walls. This is necessary in order to plate a miniature structure, such as a pole tip with a very narrow track width on the seedlayer. The problem is that the step of RIE damages the seedlayer by chemically altering the composition of the seedlayer and/or resputting the seedlayer up onto the sidewalls of the thick layer. Either effect impacts the ability to accomplish the plating objectives. There has been a long felt need in the art to provide an RIE image transfer process for plating fine features without damaging a seedlayer.

SUMMARY OF THE INVENTION

The present invention provides protection for a seedlayer while RIE is employed to pattern a thick layer prior to plating. We have discovered several materials which are not removed by RIE whether the RIE be oxygen-based or fluorine-based. Some of these materials are alumina and silicon dioxide. One of these materials is employed by the present invention as a protective layer which is formed on top of the seedlayer. After the formation of the protective layer the thick layer is formed along with the aforementioned masking and thin photoresist layers. After the thick layer has been appropriately masked it is patterned by RIE. When the RIE strikes the protective layer the seedlayer is protected. An exposed portion of the protective layer is then removed by aching, such as contact with an aqueous etchant containing EDTA. This exposes a portion of the seedlayer for plating purposes. A fine feature, such as a pole tip of a second pole piece, is then plated onto the seedlayer by electrodeposition and the thick layer is removed. If desired, the remainder of the protective layer may be removed. This leaves a freestanding pole tip of a recording head which can be submicron in track width. As stated hereinabove the invention can be used for other products in which miniature metallic structures must be formed.

An object of the present invention is to construct high resolution miniature metallic structures.

Another object is to provide a high resolution RIE image transfer process for constructing high definition miniature metallic structures.

A further object is to pattern a thick layer of material by RIE without removing or destroying an underlying seedlayer.

Still another object is to provide a protective layer for a seedlayer which is compatible with various RIE's and etchants so that various other layers employed in a fabrication process can be patterned and removed without affecting a desired resolution of the process.

Other objects, advantages and features of this invention will be more clearly understood from the following detailed description, when read in conjunction with the accompanying drawing.

BRIEF DESCRIPTION OF THE DRAWINGS

FIG. 15 is an ABS view of formation of a thin photoresist layer.

FIG. 16 is an ABS view of a patterned thin photoresist layer.

FIG. 17 is an ABS view of formation of a masking layer.

FIG. 18 is an ABS view of the patterned masking layer after lifting off the thin photoresist layer by an etchant, such as a solvent.

FIG. 19 is an ABS of patterning the thick layer of RIE.

FIG. 20 is an ABS view of exposing the top surface of the thick layer to patterned FIG. 21 is an ABS view of silylating the top surface of the thick layer for marking purposes.

DETAILED DESCRIPTION OF THE PREFERRED EMBODIMENTS

Figure 1:
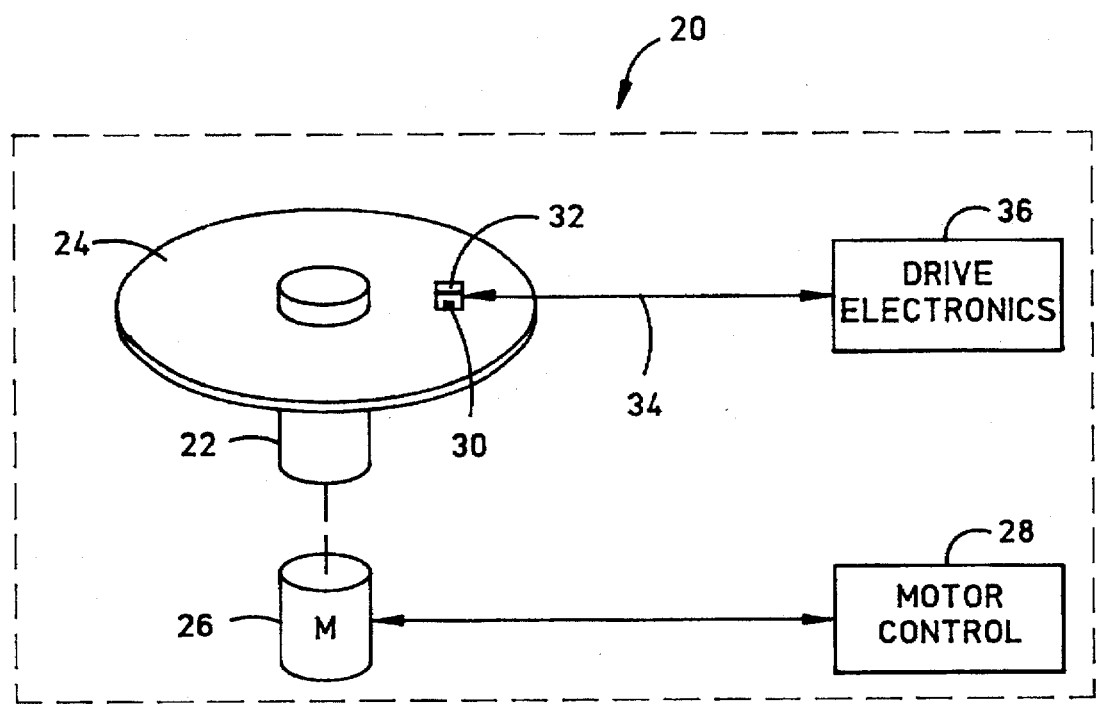
FIG. 1 is a schematic illustration of an exemplary magnetic disk drive.

Referring now to the drawings wherein like reference numerals designate like or similar parts throughout the several views, there is illustrated in FIG. 1 a magnetic disk drive 20. The drive 20 includes a spindle 22 which supports and rotates a magnetic disk 24. The spindle 22 is rotated by a motor 26 which is controlled by drive controls 28. A magnetic head 30, which may be a merged MR head for recording and reading, is mounted on a slider 32 which in turn is supported by a suspension and actuator arm 34. The suspension and actuator arm 34 positions the slider 32 so that the magnetic head 30 is in a traducing relationship with a surface of the magnetic disk 24. When the disk 24 is rotated by the motor 26 air is moved by the surface of the disk, causing the slider to ride on a cushion of air (an air bearing) slightly above the surface, in the order of 0.075 microns. The magnetic head 30 is then employed for writing information to multiple circular tracks on the surface of the disk 24 as well as reading information therefrom. These information signals as well as servo signals for moving the slider to various tracks are processed by drive electronics 36.

Figure 2:
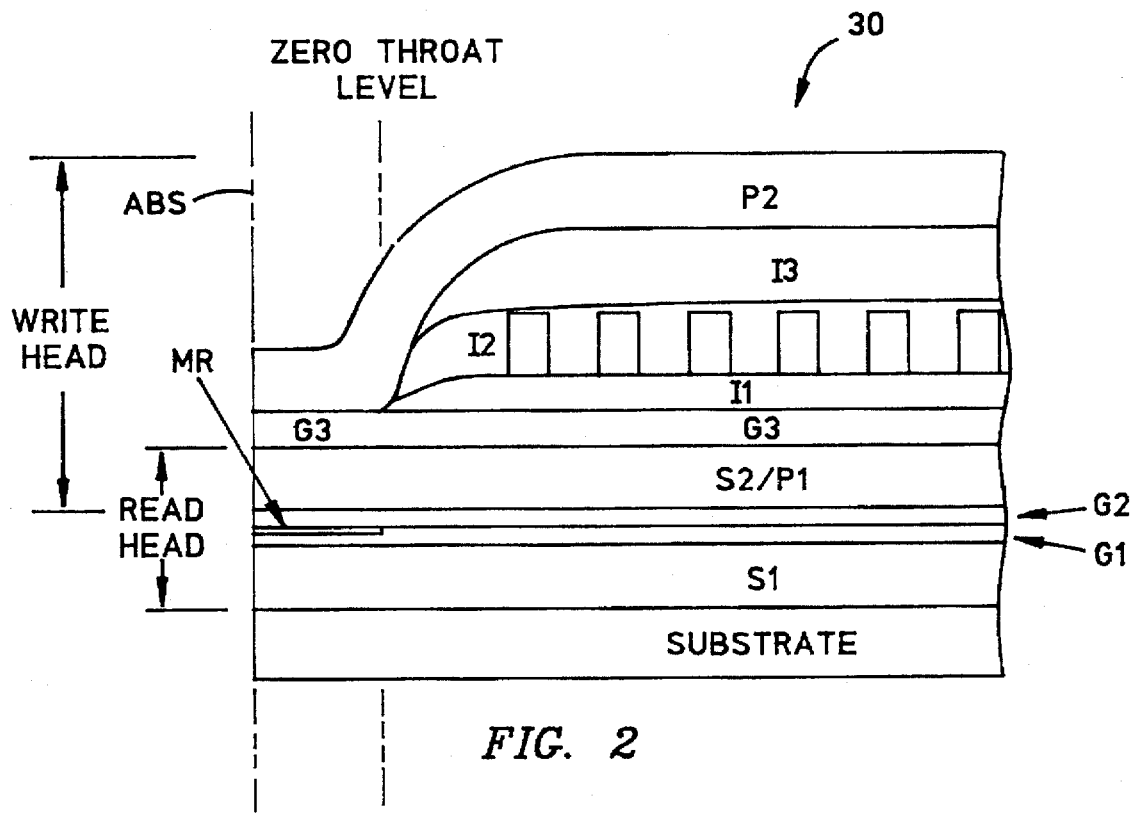
FIG. 2 is a schematic vertical cross section of a merged MR head.

FIG. 2 is a side cross sectional schematic illustration of the merged MR head 30. In the fabrication of the head, thin film layers are deposited to form an MR read head portion after which additional thin film layers are deposited to form a write head portion. This head structure embodies a merged MR read head in which a second shield layer of the MR head also serves as the first pole of the write head. The first layer formed is the first shield layer S1 which is deposited on a substrate. A first gap layer G1 is formed on top of the first shield layer S1 and an MR stripe MR is formed on top of the first gap layer G1. A second gap layer G2 is deposited on top of the MR stripe and the first gap layer G1 after which a second shield layer S2 is deposited on top of the second gap layer G2. This completes the read head portion. Since the second shield layer S2 of the read head portion also serves as a first pole piece P1 for the write head portion, the head is referred to as a merged MR head. The gap layer G3 is mounted on top of the second shield first pole piece layer S2/P1. A first insulation layer I1 is then formed on top of the gap layer G3 which stops near a zero throat level. A conductive coil layer 40 is then formed on top of the first insulation layer I1 followed by formation of a second insulation layer I2 on top of the coil layer 40 and on top of the first insulation layer I1. One or more insulation layers I3 are then formed on top of the second insulation layer I2. The insulation layers I2 and I3 terminate near the zero throat level.

The next step in the fabrication of a high resolution merged MR head 30 is the construction of the pole tip for the second pole piece P2. This is the most important step in the construction of the write head portion of the merged MR head. During recording this is the last pole tip to induce magnetic flux into the surface of a rotating magnetic disk 24. Consequently the P2 pole tip controls the resolution and trackwidth of the written signals. It is highly desirable that the width of the P2 pole tip, as seen in a direction perpendicular to the plane of FIG. 2, be as narrow as possible. By making a more narrow P2 pole tip more tracks can be written on the magnetic disk 24. The number of tracks per radial distance on the magnetic disk is known as track density and is expressed as tracks per inch. P2 pole tips have been constructed with widths in the range of 2 to 3 microns, however, it is desirable that these widths be made even narrower, such as submicron.

An image transfer process may be employed to construct P2 pole tips less than 3 microns in width. Such a process will be described for a P2 pole tip, however, it should be understood that this process applies to other well defined miniature structures as discussed hereinabove. The first step is to deposit a seedlayer on top of the gap layer G3 to provide an electrical path for the deposition of metal to form the P2 pole tip. A thick layer, such as photoresist or $SiO_2$, in the order of 5 to 6 microns, is formed on top of the seedlayer and the gap layer G3 for planarization purposes. The thick layer is then masked by the image transfer process so that reactive ion etching can be employed to pattern the thick layer. Since the reactive ion etching (RIE) is very anisotropic the thick layer is patterned with good resolution which allows the plating of a submicron P2 pole tip. The problem with RIE is that RIE damages the seedlayer. The damage interferes with the subsequent plating step. Since RIE is necessary in order to get a desirable anisotropic patterning of the thick layer there is a strong felt need in the art for protecting the seedlayer from the RIE process.

We have discovered that by providing a protective layer of a particular material over the seedlayer during the RIE process that the seedlayer is protected from RIE. Typical RIE's are oxygen based or fluorine based. The fluorine base can be $SF_6$ or $CF_4$. The material of a seedlayer is typically Permalloy ($Ni_{81}Fe_{19}$) or copper. Both of these seedlayer materials are damaged by either the oxygen based RIE or the fluorine based RIE. We have discovered that alumina or silicon dioxide is a good material for the protective layer which protects the seedlayer. Alumina is not etched by either an oxygen based or fluorine based RIE and silicon dioxide is not etched by an oxygen based RIE. The thick layer, which is employed for patterning the seedlayer prior to deposition of the P2 pole tip, can be polymeric photoresist or silicon dioxide. A thick layer of polymeric photoresist can be patterned by an oxygen based RIE and a thick layer of silicon dioxide can be patterned by a fluorine based RIE. Many different materials which are workable with the oxygen-based and fluorine-based RIEs are set forth in the following chart entitled "RIE and Suitable Materials Chart".

RIE and Suitable Materials Chart

| RIE System | Thick Layer to be Patterned by RIE | Seedlayer | Seedlayer Protecting Material |
|---|---|---|---|
| $O_2$ | Photoresist or other polymeric material | NiFe, Cu Au, Ni, NiP | $Al_2O_3$ |
| $O_2$ | Photoresist or other polymeric material | NiFe, Cu Au, Ni, NiP | $SiO_2$ or other Si containing films $Si_3N_4$ |
| $CF_4$, $SF_6$ | $SiO_2$ | NiFe, Cu Au, Ni, NiP | $Al_2O_3$ |
| $CF_4$, $SF_6$ | Si on other Si based material | NiFe, Cu Au, Ni, NiP | $Al_2O_3$ |
| $O_2$ | Carbon | NiFe, Cu Au, Ni, NiP | $Al_2O_3$ |
| $O_2$ | Carbon | NiFe, Cu Au, Ni, NiP | $SiO_2$ or other Si containing material |

Figure 3:
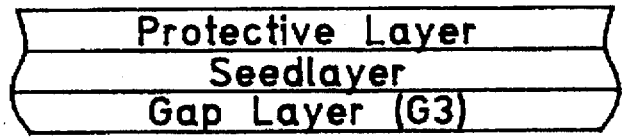
FIG. 3 is an ABS view of the formation of a gap layer, seedlayer and protection layer.
Figure 4:
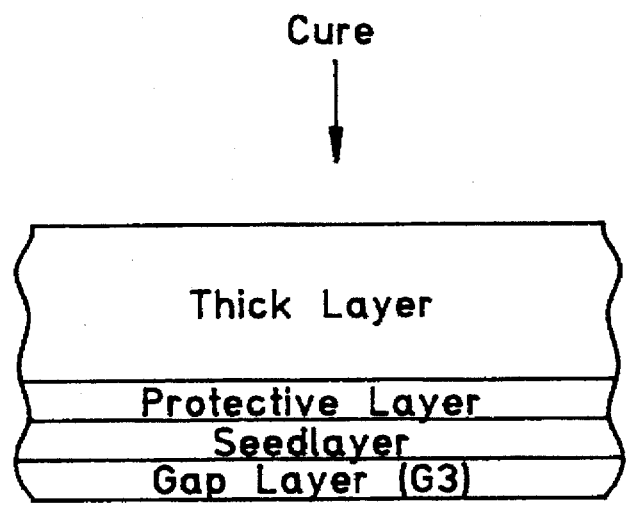
FIG. 4 is an ABS view of the formation of a thick layer.

A series of steps employed to construct a well defined miniature metallic structure, such as a P2 pole tip, in accordance with the present invention are illustrated in FIGS. 3 through 14. As stated hereinabove a gap layer G3 and a seedlayer are formed. These two layers remain throughout all of the steps shown in FIGS. 3 through 14. The seedlayer is necessary to provide a circuit for the electrodeposition of metal to form the P2 pole tip. As shown in FIG. 3, a protective layer, such as alumina or silicon dioxide, is formed on top of the seedlayer. This layer is formed by sputtering or other suitable means. The preferred protective layer is alumina since it cannot be etched by either the oxygen based or the fluorine based RIE. The next step, which is shown in FIG. 4, is to form a thick layer, such as polymeric photoresist or silicon dioxide, on top of the protective layer. It is important that this layer have a thickness at least slightly thicker than the P2 pole tip. This enables high resolution patterning of the thick layer which will be described in more detail hereinbelow. If the thick layer is polymeric photoresist it is cured, as shown in FIG. 4, so as to stabilize the material.

Figure 5:
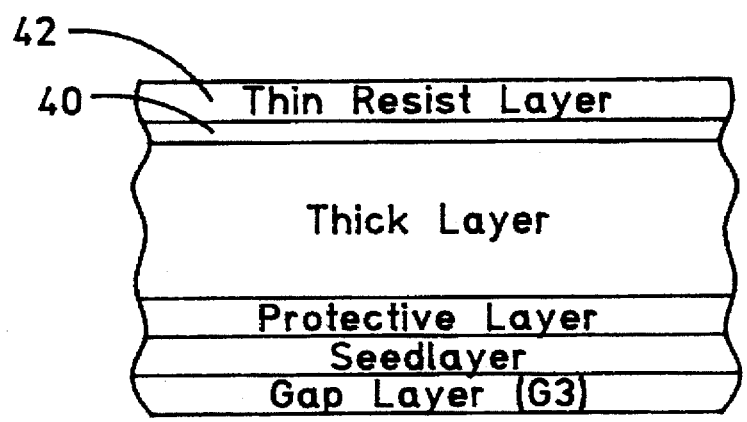
FIG. 5 is an ABS view of the formation of a masking layer and a thin photoresist
Figure 6:
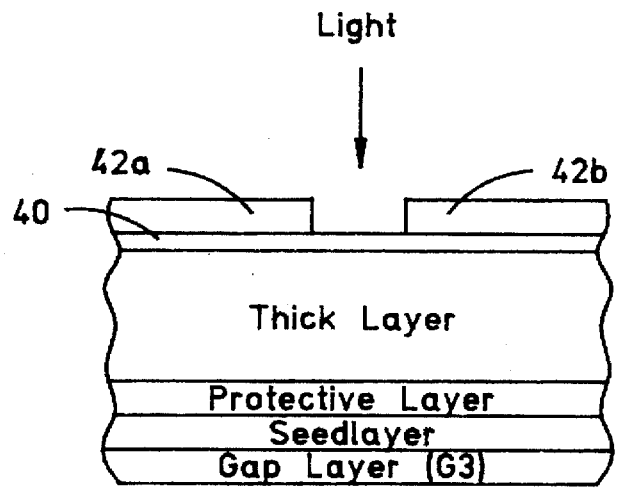
FIG. 6 is an ABS view of patterning the thin photoresist layer.
Figure 7:
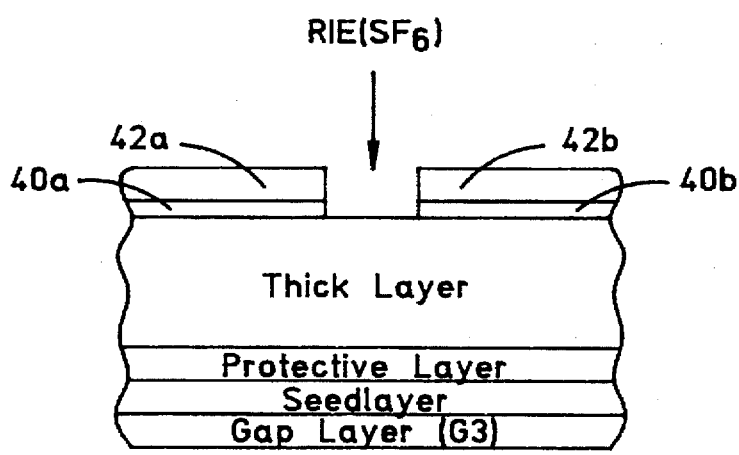
FIG. 7 is an ABS view of photo patterning the masking layer.

The next step, which is shown in FIG. 5, is the formation of a masking layer 40 on top of the thick layer and then the formation of a thin resist layer 42 on top of the masking layer 40 The thin resist layer 42 can be patterned by ordinary photolithography with good resolution because light directed on this layer for photo patterning will have minimal lateral scattering as it penetrates this small depth as compared to the lateral scattering which would occur if the same patterning was directed towards a thick layer, such as 5 to 6 microns. FIG. 6 shows a patterned thin resist layer 42a and 42b after exposure to light and removal of the exposed thin resist portion by dissolving in an aqueous solution (not shown). The masking layer 40 can be patterned with good resolution by the patterned thin resist layer 42a and 42b as a mask. A desirable material for the masking layer 40 is tantalum which can be anisotropically etched by a fluorine based RIE. Alternatively, the masking layer 40 could be tungsten. FIG. 7 shows a patterned masking layer 40a and 40b patterned with a shape that corresponds to the desired pattern for the desired P2 pole tip.

Figure 8:
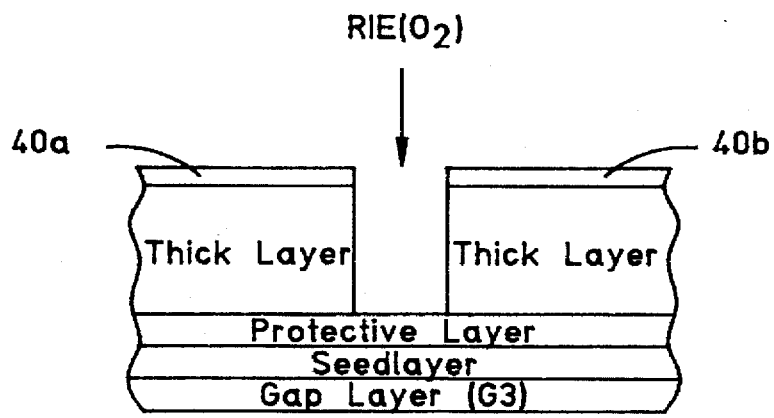
FIG. 8 is an ABS view of RIE patterning the thick layer.
Figure 9:
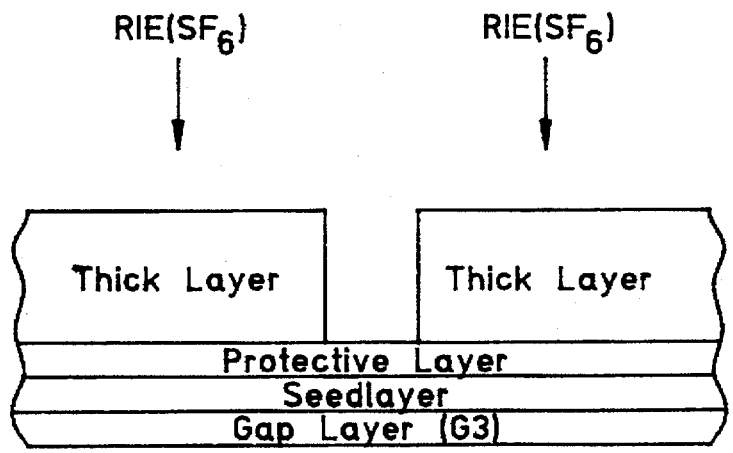
FIG. 9 is an ABS view of removing a remainder of the masking layer by RIE.
Figure 10:
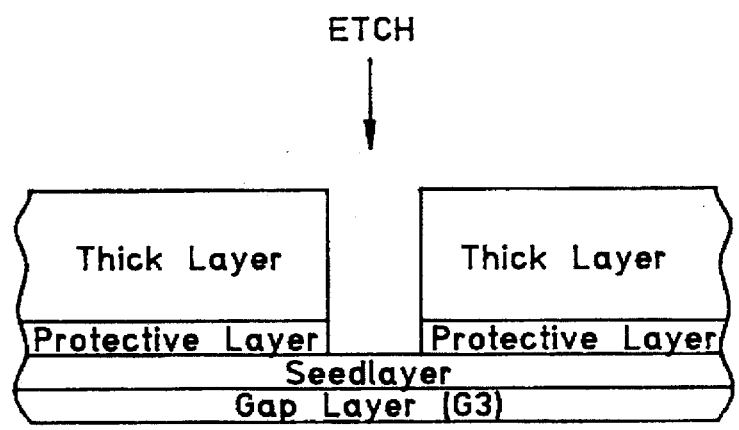
FIG. 10 is an ABS view of removing a portion of the protection layer by etching.

Using the patterned masking layer 40a and 40b as a pattern the thick layer can now be anisotropically etched by RIE, as illustrated in FIG. 8. The thick layer is patterned with a shape which corresponds with the desired shape of the P2 pole tip. The remaining patterned masking layer 40a and 40b is then removed by etching with RIE or a solvent, as shown in FIG. 9. The next step is to remove the protective layer from the seedlayer so that the seedlayer can provide an electrical path for electrodepositing metal for the P2 pole tip. This removal is accomplished by an etch of the protective layer using the thick layer as a pattern, as illustrated in FIG. 10. An alumina protective layer can be easily removed with an aqueous alkaline etchant which contains EDTA with a ph of 11 and a temperature of 60° C. This etchant is very controllable and allows removal of the alumina protective layer without undercutting the thick layer. It is important that the thick layer not be removed by the etch which removes the protective layer.

Figure 11:
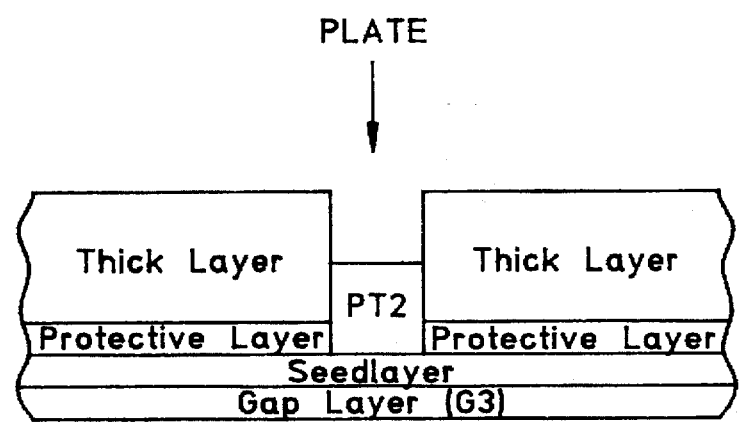
FIG. 11 is an ABS view of plating a second pole tip.
Figure 12:
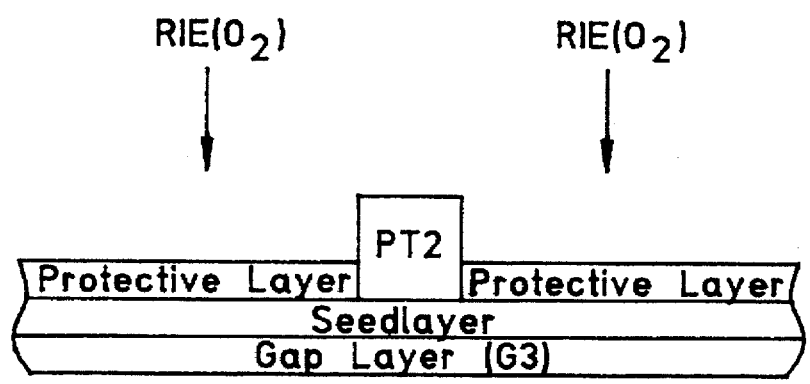
FIG. 12 is an ABS view of removing a remainder of the thick layer by RIE.
Figure 13:
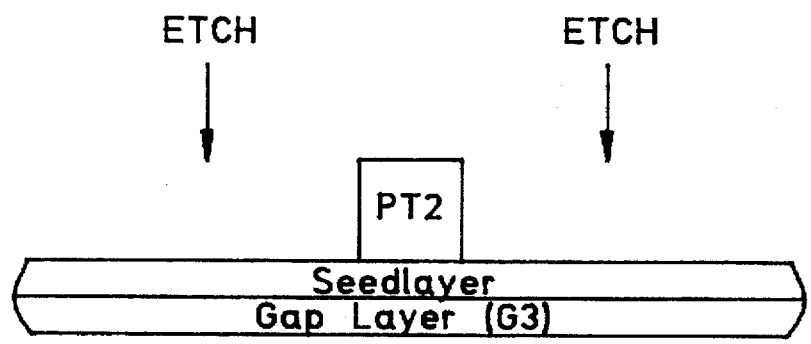
FIG. 13 is an ABS view of removing the remainder of the protection layer by etching.
Figure 14:
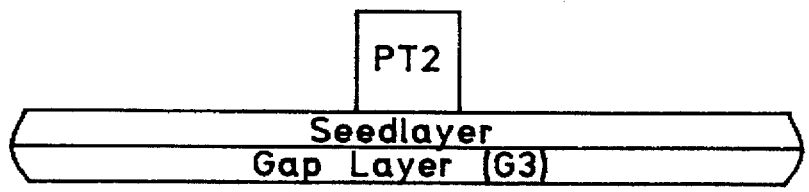
FIG. 14 is an ABS view of a freestanding second pole tip of a thin film magnetic recording head after the protection layer has been etched away.

As shown in FIG. 11 the next step is to plate the P2 pole tip by electrodeposition using the thick layer as a pattern. Because of the anisotropically formed side walls of the thick layer the side walls of the P2 pole tip can be well formed with a narrow track width. As shown in FIG. 12 the thick layer is then removed by etching, such as RIE. If the thick layer is polymeric photoresist than the RIE will be oxygen based and if the thick layer is silicon dioxide the RIE will be fluorine based. After removing the thick layer the P2 pole tip is substantially free standing with protective layer portions on each side as shown in FIG. 12. The protective layer portions can then be removed by an etch as illustrated in FIG. 13. If the protective layer is alumina, as mentioned hereinabove, the etch can be an aqueous alkaline etchant containing EDTA which is ethylene diamine tetra-acetate. After removal of the remainder of the protective layer the P2 pole tip is completed as illustrated in FIG. 14.

It should be understood that the aforementioned steps have described a high definition for the side walls of the P2 pole tip, without mention of definition for the front and back walls, which are illustrated in FIG. 2. It should be understood that the front wall of the P2 pole tip is lapped, which is a grinding process, to form an air bearing surface for the merged MR head 30. The back wall abuts the first and second insulation layers I1 and 12 near the zero throat level.

A typical thickness of the seedlayer is substantially 800 to 2,000 angstroms, a typical thickness for the protective layer is substantially 200 to 300 angstroms and a typical thickness of the thick layer is substantially 4 to 6 microns. It should be noted that the material of the thick layer is of the type which, after deposition, has a top planar surface which can be patterned by top surface imaging and reactive ion etching and which, after patterning, is removable by an etch, such as RIE, but which is not removable by the etch which removes the protective layer, such as the aqueous alkaline etchant containing EDTA. Materials mentioned for the thick layer are polymeric photoresist and silicon dioxide. It should be noted that the seedlayer is constructed of a type of material which is damaged by the RIE, the RIE being required to remove the thick layer. This damage is not desirable and is the reason for the invention. Further, the seedlayer should not be removed by the etch which removes the protective layer. When the protective layer is alumina a typical etch in this category is the aforementioned aqueous alkaline etchant containing EDTA.

Figure 15:
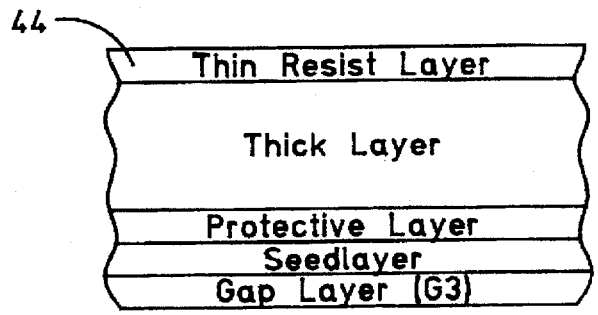
FIGS. 15 through 19 are alternative steps for the steps shown in FIGS. 6 and 7.
Figure 16:
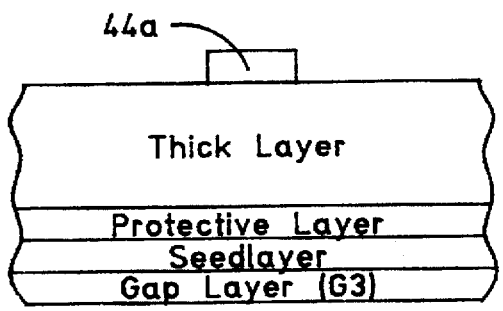
Figure 17:
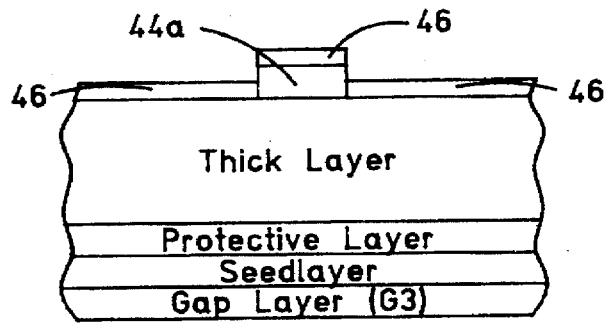
Figure 18:
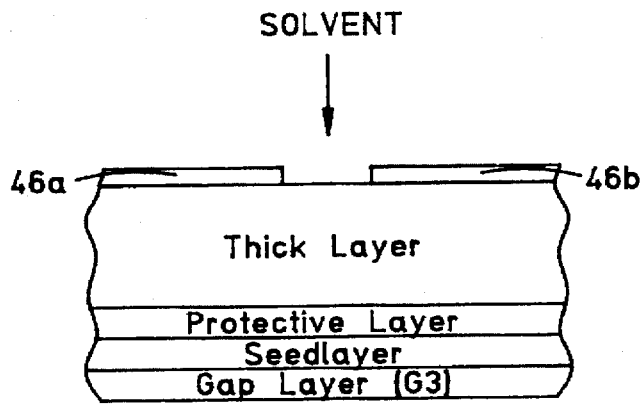
Figure 19:
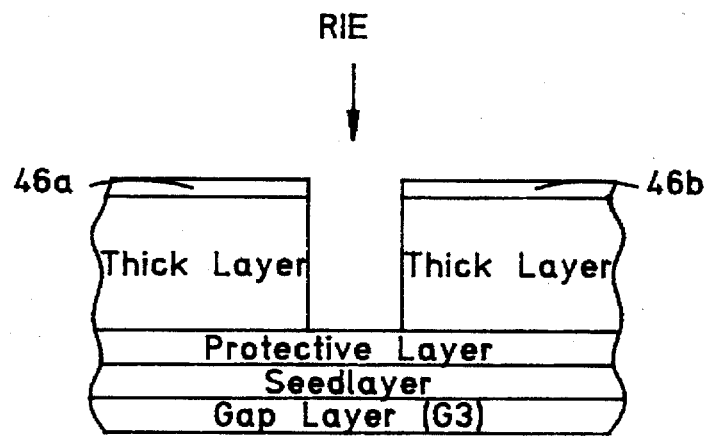

Another method of top surface imaging the thick layer is illustrated in FIGS. 15 through 19 which is a substitution for the steps illustrated in FIGS. 5 through 7. The steps shown in FIGS. 15 through 19 are essentially a photolithographic lift off process. As shown in FIG. 15, the thin resist layer 44 is formed on top of the thick layer with a thickness of approximately 1 micron. This thin resist layer is photo patterned to provide a patterned thin resist layer 44a shown in FIG. 16. A masking layer 46 is then deposited on top of the thin resist layer and on top of the thick layer as illustrated in FIG. 17. The thin resist layer is then lifted off by dissolution in a solvent leaving a patterned masking layer 46a and 46b as illustrated in FIG. 18. The thick layer can then be etched by RIE using the patterned masking layer as a pattern which is shown in FIG. 19.

Figure 20:
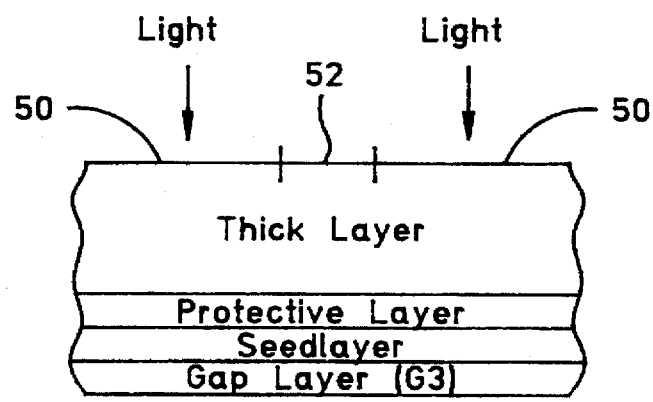
FIGS. 20 and 21 are alternative steps for the steps shown in FIGS. 5 through 7.
Figure 21:
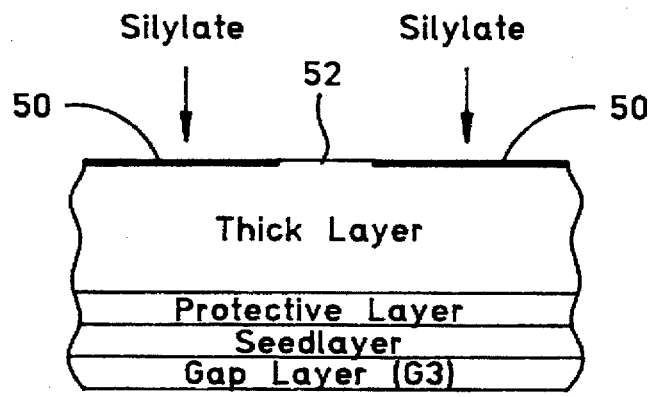

Another method of top surface imaging is illustrated in FIGS. 20 and 21 which are a substitute for the steps shown in FIGS. 5 through 7. In FIGS. 20 and 21 the thick layer is polymeric photoresist. The thick layer is patterned with light to provide light exposed and not light exposed top surface portions 50 and 52 respectively. After exposure to light the top surface of the thick layer is then subjected to silylation. Silylation is the passing of a gas over the top surface of the thick layer to react with the exposed portions 50 of the top surface of the thick layer. These reacted portions 50 are resistant to RIE. The next step is to RIE the thick layer using the silylated portions 50 as a pattern which is the same step as illustrated in FIG. 8.

It should be understood that the present invention may be employed for other fields other than the construction of a P2 pole tip for a write head. The invention can be utilized in any field where miniature metallic structures are to be formed on a seedlayer where a thick layer is patterned by reactive ion etching. Other fields which have a similar demand are electronic packaging, such as semiconductors and circuit boards, back end of line (BEOL) metallurgy for semiconductors and micromechanics, such as the construction of micromotors and actuator arms which are fabricated on wafers. The invention provides a unique method of protecting a seedlayer from RIE so that narrow width, high definition and high resolution metallic structural features can be constructed.

We claim:

1. A method of forming a miniature metallic structure over a nonconductive material layer by plating with a pattern shaped to correspond to said miniature metallic structure, the method comprising the steps of:

depositing a seedlayer on the nonconductive material layer;

depositing a protective layer on the seedlayer for protecting the seedlayer;

depositing a relatively thick layer of material on the protective layer;

the material of the relatively thick layer of material being of a type which, can be patterned by reactive ion etching, which is a first etch, and which, after patterning, is not removable by a second etch;

the seedlayer being of a type of material which is damaged by said first etch and is not removable by said second etch;

the protective layer being of a type of material which is not removable by said first etch but is removable by said second etch;

masking a top surface of the relatively thick layer to expose a surface portion of the relatively thick layer of material;

etching the relatively thick layer of material with said first etch to remove a thickness of the relatively thick layer of material below the exposed surface portion to expose a portion of the protective layer;

etching the exposed portion of the protective layer with said second etch to expose a seedlayer portion where the miniature metallic structure is to be formed;

plating a metallic layer on the exposed seedlayer portion to form the miniature metallic structure;

the miniature metallic structure being a type of material which is not removed by said first etch; and removing with said first etch the relatively thick layer of material leaving the miniature metallic structure with a protective layer around it.

2. A method as claimed in claim 1 including the steps of:

the miniature metallic structure being a material of the type which is not removed by said second etch; and removing with said second etch the protective layer around the miniature metallic structure.

3. A method as claimed in claim 1 wherein:

the miniature metallic structure is a pole tip of a second pole piece of a thin film magnetic write head.

4. A method of making a thin film magnetic write head including the method of making the miniature metallic structure as claimed in claim 3 including the steps of:

forming a first pole piece with a first pole tip;

forming a gap layer on top of the first pole tip;

forming a first insulation layer on top of the first pole piece;

forming at least one coil layer on top of the first insulation layer;

forming at least a second insulation layer on top of the coil layer; and forming a pole tip of a second pole piece on top of the gap layer, the forming of the pole tip of the second pole piece including the same steps as forming the miniature metallic structure.

5. A method of making a merged MR head including the steps of making the thin film write head of claim 4 including the steps of:

forming a first shield layer;

forming a first gap layer on top of the first shield layer;

forming a MR stripe on top of the first gap layer;

forming a second gap layer on top of the MR stripe; and forming a second shield layer on top of the second gap layer, the second shield layer also forming the first pole piece of said write head.

6. A method as claimed in claim 1 including the steps of:

the material of the protective layer being selected from one of alumina and silicon dioxide; and the step of depositing the protective layer is sputtering the protective layer.

7. A method as claimed in claim 1 wherein:

the material of the thick layer of material is one of polymeric photoresist and silicon dioxide.

8. A method as claimed in claim 1 wherein:

the first etch is one of an oxygen based reactive ion etch and a fluorine based reactive ion etch.

9. A method as claimed in claim 1 including the steps of:

the material of the seedlayer being one of NiFe and Cu; and the step of depositing the seedlayer is sputtering the seedlayer.

10. A method as claimed in claim 1 wherein:
the second etch being an aqueous alkaline etchant which contains EDTA.

11. A method as claimed in claim 1 including the steps of:
the material of the protective layer being one of alumina and silicon dioxide; and
the step of depositing the protective layer is sputtering the protective layer;
the material of the relatively thick layer of material being one of polymeric photoresist and silicon dioxide;
the first etch is one of an oxygen based reactive ion etch and a fluorine based reactive ion etch;
the material of the seedlayer being one of NiFe and Cu;
the step of depositing the seedlayer is sputtering the seedlayer; and
the second etch being an aqueous alkaline etchant which contains EDTA.

12. A method as claimed in claim 1 wherein:
the thickness of the seedlayer is substantially 800–2000 A; and
the thickness of the protective layer is substantially 200–300 A.

13. A method as claimed in claim 1 wherein the step of masking the top surface of the relatively thick layer of material includes the steps of:
exposing a top surface of the relatively thick layer of material with light to form a light exposed top surface portion and a not light exposed top surface portion, the top surface portions having shapes corresponding to said pattern; and
silylating the top surface of the thick layer of material to silylate only one of the light exposed and not light exposed top surface portions.

14. A method as claimed in claim 1 wherein the step of masking the top surface of the relatively thick layer of material includes the steps of:
depositing a masking layer over the relatively thick layer of material;
patterning the masking layer to expose a top surface portion of the relatively thick layer of material which corresponds to said pattern; and
the masking layer being of a material of the type which is not removed by said first etch.

15. A method as claimed in claim 14 wherein the step of masking the top surface of the relatively thick layer of material includes the steps of:
before depositing said masking layer, curing the relatively thick layer of material;
depositing a thin resist layer on top of the masking layer;
patterning the thin resist layer to expose a portion of the masking layer which corresponds to said pattern;
removing the exposed portion of the masking layer to expose a portion of the top surface of the relatively thick layer of material which corresponds to said pattern.

16. A method as claimed in claim 15 wherein:
the masking layer is tantalum.

17. A method as claimed in claim 14 wherein the step of masking the top surface of the relatively thick layer of material includes the steps of:
depositing a thin resist layer on top of the relatively thick layer of material;
patterning the thin resist layer with said pattern leaving a thin resist layer portion which covers a portion of the thick layer of material;
depositing a masking layer on top of the thin resist portion and on top of the relatively thick layer of material; and
removing the thin resist portion and a masking layer portion thereon to expose the portion of the top surface of the relatively thick layer of material which corresponds to said pattern.

18. A method as claimed in claim 1 wherein:
the material of the protective layer is one of alumina and silicon dioxide; and
the protective layer is deposited by sputtering.

19. A method as claimed in claim 18 wherein:
the material of the relatively thick layer is one of polymeric photoresist and silicon dioxide; and
the reactive ion etch is one of oxygen based and fluorine based.

20. A method as claimed in claim 19 including the steps of:
the miniature metallic structure is a material of the type which is not removed by said second etch; and
removing with said second etch the protective layer around the miniature metallic structure.

21. A method as claimed in claim 20 wherein the step of masking the top surface of the thick layer of material includes the steps of:
depositing a masking layer on the top of the thick layer of material;
patterning the masking layer to expose said surface portion of the relatively thick layer of material; and
the masking layer being of a material of the type which is not removed by said first etch.

22. A method as claimed in claim 21 wherein the step of masking the top surface of the relatively thick layer of material includes the steps of:
before depositing said masking layer, curing the relatively thick layer of material;
depositing a thin resist layer on top of the masking layer;
patterning the thin resist layer to expose a portion of the masking layer which corresponds to said pattern; and
removing the exposed portion of the masking layer to expose said surface portion of the relatively thick layer of material which corresponds to said pattern.

23. A method as claimed in claim 22 including the steps of:
the masking layer being tantalum.

24. A method as claimed in claim 23 including the steps of:
the material of the seedlayer being one of NiFe and Cu; and
the step of depositing the seedlayer is sputtering the seedlayer.

25. A method as claimed in claim 24 wherein:
the second etch being an aqueous alkaline etchant which contains EDTA.

26. A method of making a thin film magnetic write head including the method of making the miniature metallic structure as claimed in claim 25 including the steps of:
forming a first pole piece with a first pole tip;
forming a gap layer on top of the first pole tip;
forming a first insulation layer on top of the first pole piece;
forming at least one coil layer on top of the first insulation layer;
forming at least a second insulation layer on top of the coil layer; and forming a pole tip of a second pole piece on top of the gap layer, the forming of the pole tip of the second pole piece being the forming of the miniature metallic structure.

27. A method of making a merged MR head including the steps of making the thin film write head of claim 26 including the steps of:

forming a first shield layer;

forming a first gap layer on top of the first shield layer;

forming a MR stripe on top of the first gap layer;

forming a second gap layer on top of the MR stripe; and forming a second shield layer on top of the second gap layer, the second shield layer also forming the first pole piece of said write head.

28. A method of forming a miniature metallic structure over a nonconductive material layer by plating with a pattern shaped to correspond to said miniature metallic structure, the method comprising the steps of:

depositing a seedlayer on the nonconductive material layer;

depositing a protective layer on the seedlayer for protecting the seedlayer;

depositing a relatively thick layer of material directly on the protective layer;

providing a first etch which will etch said thick layer and said seedlayer, but will not etch said protective layer and said metallic structure;

providing a second etch which will etch the protective layer, but will not etch said thick layer and said seedlayer;

masking a top surface of the relatively thick layer to expose a surface portion of the relatively thick layer of material;

etching the relatively thick layer of material with said first etch to remove a thickness of the relatively thick layer of material below the exposed surface portion to expose a portion of the protective layer;

etching the exposed portion of the protective layer with said second etch to expose a seedlayer portion where the miniature metallic structure is to be formed;

plating a metallic layer on the exposed seedlayer portion to form the miniature metallic structure; and removing with said first etch the relatively thick layer of material leaving the miniature metallic structure with a protective layer around it.

29. A method as claimed in claim 1 including the steps of:

said providing a second etch further providing a second etch which will not etch said metallic structure; and removing with said second etch the protective layer around the miniature metallic structure.

30. A method as claimed in claim 1 wherein the step of masking the top surface of the relatively thick layer of material includes the steps of:

providing a photoresist layer for said relatively thick layer of material;

curing the photoresist layer;

depositing a masking layer over the photoresist layer;

depositing a thin resist layer on top of the masking layer;

patterning the thin resist layer to expose a portion of the masking layer which corresponds to said pattern;

removing the exposed portion of the masking layer to expose a portion of a top surface of the photoresist layer which corresponds to said pattern; and said providing a first etch further providing a first etch which does not etch said masking layer.

31. A method as claimed in claim 1 wherein:

the first etch is one of an oxygen based reactive ion etch and a fluorine based reactive ion etch.

32. A method as claimed in claim 1 wherein:

the second etch being an aqueous alkaline etchant which contains EDTA.

33. A method as claimed in claim 32 wherein:

the first etch is one of an oxygen based reactive ion etch and a fluorine based reactive ion etch.

34. A method as claimed in claim 1 including the steps of:

the material of the protective layer being one of alumina and silicon dioxide; and the step of depositing the protective layer is sputtering the protective layer;

the material of the relatively thick layer of material being one of polymeric photoresist and silicon dioxide;

the first etch is one of an oxygen based reactive ion etch and a fluorine based reactive ion etch;

the material of the seedlayer being one of NiFe and Cu;

the step of depositing the seedlayer is sputtering the seedlayer; and the second etch being an aqueous alkaline etchant which contains EDTA.

35. A method as claimed in claim 34 including the steps of:

said providing a second etch further providing a second etch which will not etch said metallic structure; and removing with said second etch the protective layer around the miniature metallic structure.

36. A method as claimed in claim 35 wherein the step of masking the top surface of the relatively thick layer of material includes the steps of:

providing a photoresist layer for said relatively thick layer of material;

curing the photoresist layer;

depositing a masking layer over the photoresist layer;

depositing a thin resist layer on top of the masking layer;

patterning the thin resist layer to expose a portion of the masking layer which corresponds to said pattern;

removing the exposed portion of the masking layer to expose a portion of a top surface of the photoresist layer which corresponds to said pattern; and said providing a first etch further providing a first etch which does not etch said masking layer.

37. A method as claimed in claim 36 wherein:

the miniature metallic structure is a pole tip of a second pole piece of a thin film magnetic write head.

38. A method of making a thin film magnetic write head including the method of making the miniature metallic structure as claimed in claim 37 including the steps of:

forming a first pole piece with a first pole tip;

forming a gap layer on top of the first pole tip;

forming a first insulation layer on top of the first pole piece;

forming at least one coil layer on top of the first insulation layer;

forming at least a second insulation layer on top of the coil layer; and forming a pole tip of a second pole piece on top of the gap layer, the forming of the pole tip of the second pole piece including the same steps as forming the miniature metallic structure.

39. A method of making a merged MR head including the steps of making the thin film write head of claim 38 including the steps of:

forming a first shield layer;

forming a first gap layer on top of the first shield layer;

forming a MR stripe on top of the first gap layer;

forming a second gap layer on top of the MR stripe; and forming a second shield layer on top of the second gap layer, the second shield layer also forming the first pole piece of said write head.

* * * * *